US007644333B2

(12) United States Patent
Hill et al.

(10) Patent No.: US 7,644,333 B2
(45) Date of Patent: Jan. 5, 2010

(54) RESTARTABLE LOGIC BIST CONTROLLER

(76) Inventors: Christopher John Hill, 14 Blenheim Close, Valley Park, Chandlers Ford, Hampshire, SO53 4LD (GB); Thomas Hans Rinderknecht, 8593 SW. Iroquois Dr., Tualatin, OR (US) 97062

( * ) Notice: Subject to any disclaimer, the term of this patent is extended or adjusted under 35 U.S.C. 154(b) by 198 days.

(21) Appl. No.: 10/194,377

(22) Filed: Jul. 12, 2002

(65) Prior Publication Data
US 2003/0115525 A1 Jun. 19, 2003

Related U.S. Application Data

(60) Provisional application No. 60/342,062, filed on Dec. 18, 2001.

(51) Int. Cl.
*G01R 31/28* (2006.01)
(52) U.S. Cl. .................. 714/732; 714/726; 714/733
(58) Field of Classification Search ................. 714/732, 714/755
See application file for complete search history.

(56) References Cited

U.S. PATENT DOCUMENTS

| | | | | |
|---|---|---|---|---|
| 4,503,537 | A | * | 3/1985 | McAnney .................... 714/728 |
| 5,410,547 | A | * | 4/1995 | Drain ......................... 714/732 |
| 5,694,402 | A | * | 12/1997 | Butler et al. ................. 714/732 |
| 5,748,640 | A | * | 5/1998 | Jiang et al. .................. 714/720 |
| 6,311,311 | B1 | | 10/2001 | Swaney et al. |
| 6,510,534 | B1 | * | 1/2003 | Nadeau-Dostie et al. ..... 714/724 |
| 7,096,397 | B2 | | 8/2006 | Kundu et al. |

2002/0174393 A1 * 11/2002 Udawatta et al. ............ 714/726

OTHER PUBLICATIONS

Abramovici, Miron, Breur, Melvin, and Friedman, Arthur. *Digital Systems Testing and Testable Design*. IEEE Press, 1990.*
Wikipedia. Flip-flop. http://en.wikipedia.org/wiki/Flip-flop.*
Wikipedia. Shift Register. http://en.wikipedia.org/wiki/Shift_register.*
Youn, Hee Yong. "Compact testing with intermediate signature analysis". VLSI Test Symposium, 1991. ' Chip-to-System Test Concerns for the 90's', Digest of Papers Apr. 15-17, 1991 pp. 47-52.*
Mentor Graphics Corporation, *LBISTArchitect Reference Manual V8.9_1.10*, pp. 2-96-2-98 (Dec. 2000).
Mentor Graphics Corporation, *Built-In Self-Test Process Guide V8.9_1.10*, p. 5-15 (Dec. 2000).

* cited by examiner

*Primary Examiner*—Kevin L Ellis
*Assistant Examiner*—Steve Nguyen
(74) *Attorney, Agent, or Firm*—Klarquist Sparkman, LLP

(57) ABSTRACT

A method and apparatus for testing an integrated circuit using built-in self-test (BIST) techniques is described. In one aspect, a BIST circuit comprises a scan monitor with hold logic and a signature generation element. The hold logic is operable to suspend signature generation in the signature generation element at any desired point in the test sequence. In some embodiments, the hold logic comprises a scan-loadable signature hold flip-flop which allows the logic BIST controller to be restarted from any selected pattern within a pattern range and to run to any subsequent pattern. The BIST session can be run incrementally, testing and reporting intermediate MISR signatures. External automatic testing equipment can suspend signature generation at selected times during a BIST session to prevent tainting of the signature generation element. The hold logic also may comprise a rotating hold ring to suspend signature generation during predetermined shift cycles.

24 Claims, 12 Drawing Sheets

RESTARTABLE LOGIC BIST CONTROLLER

CROSS REFERENCE TO RELATED APPLICATION

This application claims priority from U.S. Provisional Application No. 60/342,062, filed Dec. 18, 2001, which is incorporated herein by reference.

FIELD

This invention relates generally to the testing of integrated circuits, and, more particularly, testing integrated circuits in a BIST (built-in self-test) environment.

BACKGROUND

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. Second, larger circuits require a prohibitively large volume of test data that must be then stored in external testing equipment. Third, applying the test data to a large circuit requires an increasingly long test application time. And fourth, present external testing equipment is unable to test such larger circuits at their speed of operation.

Integrated circuits are presently tested using a number of structured design for testability (DFT) techniques. These techniques rest on the general concept of making all or some state variables (memory elements such as flip-flops and latches) directly controllable and observable. If this can be arranged, a circuit can be treated, as far as testing of combinational faults is concerned, as a combinational or a nearly combinational network. The most-often used DFT methodology is based on scan chains. It assumes that during testing all (or almost all) memory elements are connected into one or more shift registers, as shown in U.S. Pat. No. 4,503,537. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test (CUT) works properly.

Scan design methodology has gained widespread adoption by virtue of its simple automatic test pattern generation (ATPG) and silicon debugging capabilities. Today, ATPG software tools are so efficient that it is possible to generate test sets (a collection of test patterns) that guarantee almost complete fault coverage of several types of fault models including stuck-at, transition, path delay faults, and bridging faults. Typically, when a particular potential fault in a circuit is targeted by an ATPG tool, only a small number of scan cells, e.g., 2-5%, must be specified to detect the particular fault (deterministically specified cells). The remaining scan cells in the scan chains are filled with random binary values (randomly specified cells). This way the pattern is fully specified, more likely to detect some additional faults, and can be stored on a tester.

In a conventional system for testing digital circuits with scan chains, external automatic testing equipment (ATE) applies a set of fully specified test patterns one by one to a CUT in scan mode via scan chains within the circuit. The circuit is then run in normal mode using the test pattern as input, and the test response to the test pattern is stored in the scan chains. With the circuit again in scan mode, the response is then routed to the ATE, which compares the response with a fault-free reference response, also one by one. For large circuits, this approach becomes infeasible because of large test set sizes and long test application times. It has been reported that the volume of test data can exceed one kilobit per single logic gate in a large design. The significant limitation of this approach is that it requires an expensive, memory-intensive tester and a long test time to test a complex circuit.

These limitations of time and storage can be overcome to some extent by adopting a built-in self-test (BIST) framework as shown in FIG. 1. In BIST, additional on-chip circuitry is included to generate test patterns, evaluate test responses, and control the test. Logic BIST controller 100 tests circuit under test (CUT) 110. Typically, automated testing equipment (ATE) 120 is used together with logic BIST controller 100 during testing. A typical logic BIST controller contains a number of component parts including a scan driver 130 containing a device for generating test pattern data, such as pseudo-random pattern generator (PRPG) 140, a scan monitor 150 containing a multiple input shift register (MISR) 160, a shift counter (not shown), and a pattern counter (not shown). Components of a BIST controller may further include additional components, such as a phase shifter in the scan driver and/or a space compactor in the scan monitor.

PRPG 140 is used to generate the test patterns, instead of having deterministic test patterns. PRPGs typically are implemented as a hardware structure called a linear feedback shift register (LFSR). An LFSR comprises a sequence of chained data memory elements forming a shift register. A given LFSR of length n can be represented by its characteristic polynomial $h_n x^n + \ldots + h_1 x + h_0$, where the term $h_i x^i$ refers to the ith flip-flop of the register, such that, if $h_i = 1$, then there is a feedback tap taken from this flip-flop. When the proper tap connections are established in accordance with the given polynomial, the combined (added modulo 2) output of each stage is feedback to the first stage of the LFSR. Such an implementation is called type I LFSR or Fibonacci generator. An alternative implementation uses a shift register with XOR gates placed between the LFSR cells. It is called type II LFSR or Galois true divisor. A distinct feature of this configuration is that the output of the last stage of the LFSR is being fed back to those stages, which are indicated by the characteristic polynomial employed. A polynomial which causes an n-bit LFSR to go through all possible $2^n - 1$ nonzero states is called a primitive characteristic polynomial. A corresponding LFSR is often referred to as a maximum-length LFSR, while the resultant output sequence is termed a maximum-length sequence or m-sequence.

The pattern counter controls sequences of test patterns generated by PRPG 140 and applied though scan chains 170, 172 and 174 of CUT 110. To reduce correlation between scan chains 170, 172 and 174 in CUT 110, a phase shifter can be inserted between PRPG 140 and the scan chains. A typical phase shifter consists of exclusive-or (XOR) network employed to avoid shifted versions of the same data in various scan paths.

Test pattern data generated by PRPG 140 is sequentially loaded, or shifted, into scan chains 170, 172 and 174. The shift counter indicates how many shift cycles must be performed before all scan chains in CUT 110 have been filled. As each test data bit is shifted in, the response to a test data bit shifted in during the previous pattern is shifted out of scan chains 170, 172 and 174 and into a MISR 160, or a similar signature generation element, in the scan monitor. MISR 160 compresses the response data into a signature which can be analyzed for errors. The number of inputs to MISR 160 cannot exceed the number of bits in the MISR. A space compactor (not shown) may be used if there are more scan chains in CUT 110 than there are bits in a MISR. The space compactor combines adjoining scan chains using XOR gate structures until the number of space compactor outputs is equal to the number of bits, or stages, in the MISR.

Once a complete load/unload operation has been performed, CUT 110 enters a non-scan mode. A system capture operation can be performed to capture response data. During capture operations, output from the scan chains is not shifted into the MISR, and test patterns are not input to the scan chains. Thus, the MISR and the PRPG are typically placed in a non-functional state during capture operations to avoid timing problems. After capture, the system is ready for the next load/unload operation.

This concurrent load/unload activity causes a potential problem. Although the PRPG and MISR may be reset to known values when the logic BIST controller is reset, the first load/unload cycle causes an unknown and potentially uninitialized state of the scan chains to be passed into the scan monitor and hence the MISR. This causes the MISR to become tainted with unknown data. Previous solutions to this tainting problem included initializing the scan chains to a known state prior to running the BIST session (often referred to as external initialization) or masking the MISR inputs by forcing them to known values (such as all 1s or all 0s) until the first capture operation is complete (often referred to as internal or controller initialization).

Internal initialization, or masking, can be used to force MISR inputs to a known value during a masked initial pattern. The masking process is controlled by a mask control signal. Typically, the mask signal is generated by combinational logic, either by comparing the pattern counter with the known constant value for the first pattern if internal initialization is being performed, or by driving it with a constant "no mask" value if external initialization is being performed. External initialization also can be performed without masking circuitry.

FIG. 2 shows an X-bit MISR 160 containing masking hardware. MISR 160 includes flip-flops 210, 212 and 214, multiplexors 220, 222 and 224, XOR gates 230, 232 and 234, and clock signal 240. Response data from scan chains 170, 172 and 174 in CUT 110 are shifted into MISR 160 via scan out signals 250, 252 and 254. Mask signal 260, which is coupled to inverter 270 and AND gates 280, 282 and 284, masks the inputs to the MISR by driving all MISR inputs low during the first pattern (pc=0) of a test sequence. In such an arrangement, the MISR inputs are not masked after the first pattern.

Other logic BIST controllers have allowed suspending MISR signature generation only during capture operations or after the test responses for the last pattern of a test sequence have been shifted into the MISR. For example, referring to FIG. 2, bist_done signal 290 and capture_operation signal 292 can set (via OR gate 294) multiplexors 220, 222 and 224 such that the signature stored in flip-flops 210, 212 and 214 in the MISR is not changed 1) after the test responses for the last pattern of a test sequence have been shifted into the MISR, or 2) during a capture operation, respectively.

However, such solutions to the tainting problem are unsatisfactory because such solutions do not allow suspending MISR signature generation at any other points. Additionally, current EDA synthesis tools may make masking operations ineffective by performing undesirable logic reduction during circuit optimization.

SUMMARY

A method and apparatus for testing an integrated circuit using built-in self-test (BIST) techniques is described.

In one aspect, a BIST circuit to test logic within an integrated circuit comprises a scan driver coupled to a circuit under test to generate a sequence of test patterns in a test of the integrated circuit and a scan monitor coupled to the circuit under test to receive results of applying test patterns in the sequence of test patterns to the circuit under test (e.g., by applying the test patterns to scan chains). The sequence of test patterns comprises at least a first test pattern and a last test pattern. The scan monitor comprises hold logic and a signature generation element. The hold logic is operable to suspend signature generation at any desired point in the test sequence, and testing can be restarted at any desired point in the test sequence. In one embodiment, signature generation in the signature generation element is suspended for the first pattern in a test sequence (e.g., the pattern where the pattern count is equal to 0 (pc=0)).

In some embodiments, the hold logic comprises a scan-loadable signature hold flip-flop. When used with a pattern counter module having programmable start and stop values, the scan-loadable signature hold flip-flop makes it possible to restart the logic BIST controller from any selected pattern within a pattern range for which the logic BIST controller has been configured, and to run the test from the selected pattern to any desired subsequent pattern. In this manner, the BIST session can be run incrementally, testing and reporting intermediate MISR signatures as the test run progresses. The signature hold flip-flop also may be coupled to a serial shift register interface.

In some embodiments, hold logic can be implemented such that external automatic testing equipment can temporarily suspend signature generation in a signature generation element at selected times during a BIST session. Suspending signature generation with an external hold signal prevents complete patterns or individual shift cycles from tainting the signature generation element with X states.

The hold logic also may comprise a rotating hold ring comprising a flip-flop for each shift cycle in a test pattern. When running, the rotating hold ring produces a signal for suspending signature generation. The signal is either active or inactive for a given clock cycle depending on the states of the flip-flops. In some embodiments, the signal is active during clock cycles in which signature generation in a signature generation element is to be suspended, and inactive during clock cycles in which signature generation is to be enabled. The rotating hold ring can suspend signature generation during predetermined shift cycles.

These features and others of the described embodiments will be more readily apparent from the following detailed description which proceeds with reference to the accompanying drawings.

DETAILED DESCRIPTION

In the embodiments described herein, shortcomings of previous solutions are overcome by using a logic BIST controller with dynamic signature hold logic.

Overview of Logic BIST Controller with Dynamic Signature Hold Logic

Figure 1:
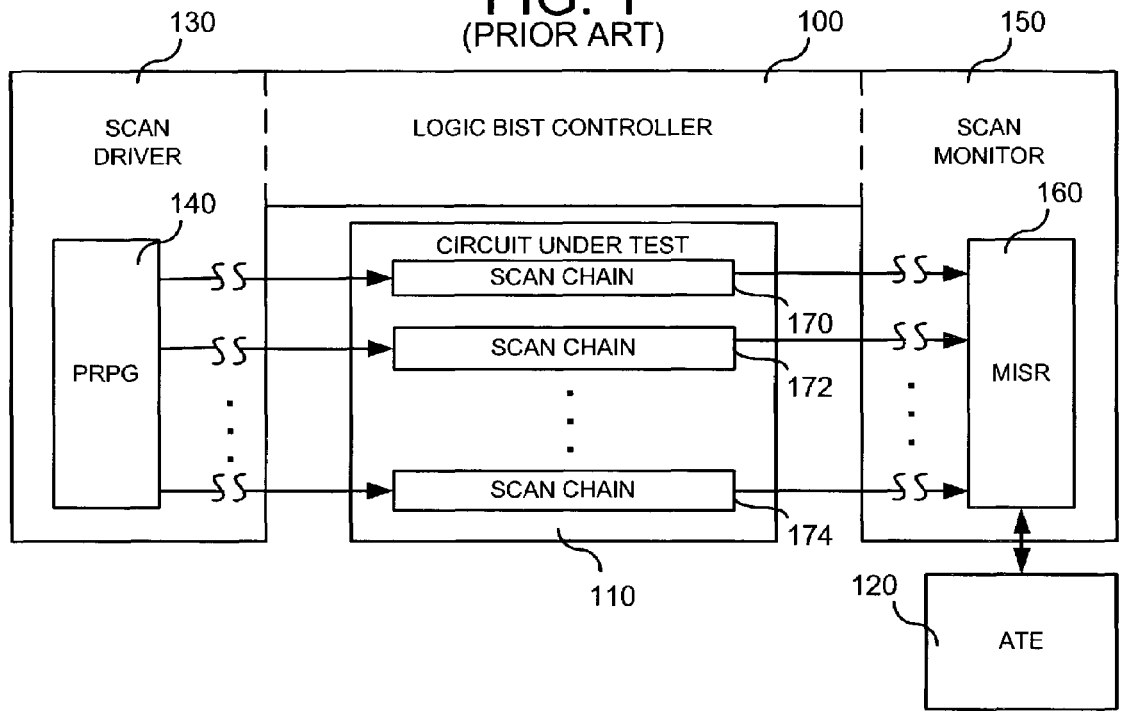
FIG. 1 illustrates a prior art logic BIST controller without dynamic signature hold logic.
Figure 3:
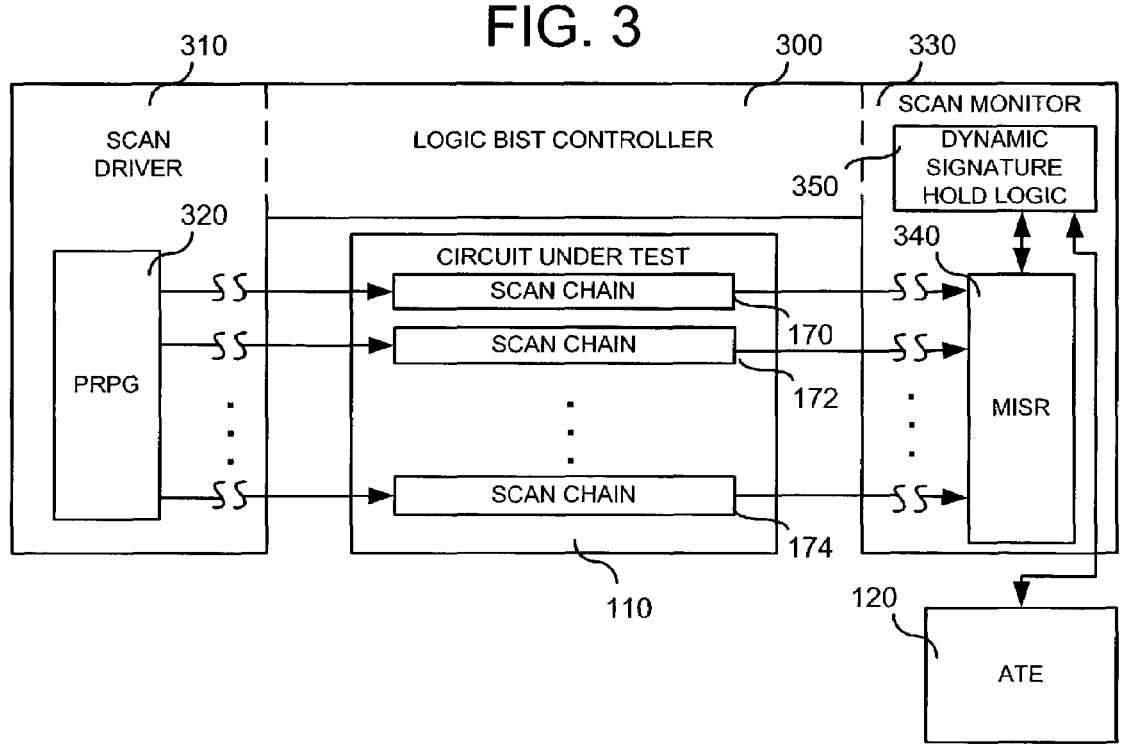
FIG. 3 is a high level block diagram of a logic BIST controller comprising dynamic signature hold logic which may suspend signature generation or be restarted at any desired point during a test sequence.
Figure 2:
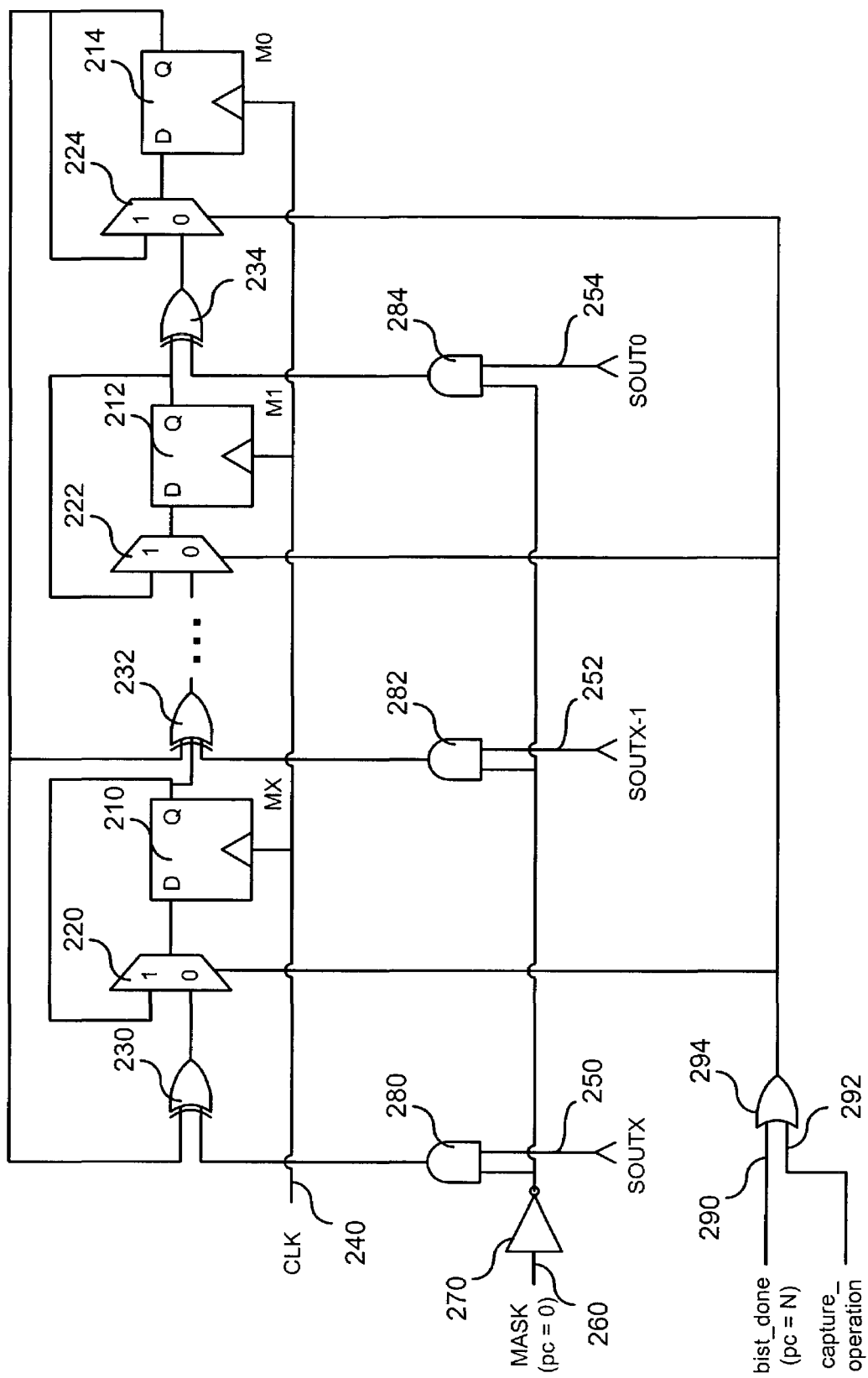
FIG. 2 is a prior art circuit diagram of an arrangement allowing signature generation in a MISR to be suspended only during capture operations or after the test responses for the last pattern of a test sequence have been shifted into the MISR.

In an illustrated embodiment, referring to FIG. 3, logic BIST controller 300 comprises a scan driver 310 (which includes a PRPG 320) and a scan monitor 330. Scan monitor 330 comprises a signature generation element (e.g., MISR 340), which is coupled to dynamic signature hold logic 350. Dynamic signature hold logic 350 allows logic BIST controller 300 to suspend signature generation in the signature generation element for patterns (or portions of patterns) during logic BIST testing. Dynamic signature hold logic 350 also allows logic BIST controller 300 to be restarted at any desired point in a test sequence. Suspending signature generation is not a masking of input data, but holding a current value of a signature through either suspending clock signals or through resupplying the signature to itself in a feedback loop. The suspending occurs while test patterns continue to be supplied to the scan chains. Dynamic signature hold logic 350 allows accurate, efficient testing of circuits under test, such as CUT 110. Dynamic signature hold logic 350 can be implemented in many ways. The embodiments described below are exemplary, but not exhaustive.

Referring again to FIG. 3, during logic BIST testing, PRPG 320 generates test pattern data, which is used for testing circuit under test (CUT) 110. A pattern counter (not shown) controls and tracks the sequences of test patterns generated by PRPG 320. Test pattern data is sequentially loaded, or shifted, into scan chains 170, 172 and 174 from PRPG 320. To reduce correlation between scan chains 170, 172 and 174 in CUT 110, a phase shifter can be inserted between PRPG 320 and the scan chains. A typical phase shifter consists of an exclusive-or (XOR) network employed to avoid shifted versions of the same data in various scan paths.

As each test data bit in a current pattern is shifted in, the response to a test data bit shifted in during the previous pattern is shifted out of scan chains 170, 172 and 174 and into a signature generation element (e.g., MISR 340) in scan monitor 330. A shift counter (not shown) tracks how many shift cycles (e.g., clock cycles during which one or more response bits are shifted into the MISR) are performed before all scan chains in CUT 110 have been filled.

Once a complete load/unload operation has been performed, CUT 110 enters a non-scan mode. A system capture operation is performed to capture the test response data that is shifted into MISR 340 during the next load/unload operation. After capture, the system is ready for the next load/unload operation.

The number of inputs to MISR 340 can not exceed the number of bits in the MISR. A space compactor (not shown) may be used if there are more scan chains in CUT 110 than there are bits in MISR 340. Space compactors combine adjoining scan chains using XOR gate structures until the number of space compactor outputs is equal to the number of bits, or stages, in the MISR.

MISR 340 generates a signature based on the responses to the test data, which can be analyzed for errors. For example, a signature generated by MISR 340 may be compared against a "known" good value to determine whether any responses to the test data are erroneous. "Known" good values may be stored in and/or obtained from a variety of sources, such as ATE 120. At any desired time during the test, signature generation may be suspended (e.g., for a series of test patterns, for a single test pattern, or for a portion of a test pattern) to avoid corrupting the MISR signature. Dynamic signature hold logic 350 can also be used to start (or restart) testing at different points in a test sequence and to run different subsequences within a test sequence for diagnostic purposes.

Suspending Signature Generation for the First Pattern in a Test Sequence

In one embodiment, signature generation in a signature generation element (e.g., a MISR) is suspended for the first pattern in a test sequence (e.g., the pattern where the pattern count is equal to 0 (pc=0)). When the signature generation is suspended during the loading of the first pattern into the scan chains, the uninitialized data that is simultaneously unloaded from the scan chains does not change the signature in the signature generation element. Instead, the signature remains set at an initialization value (e.g., all 1s) until after the first capture operation. Initially, a small reduction in fault coverage occurs within the BIST controller because the signature will not change when signature generation is suspended. However, this test coverage is soon recovered when the second pattern is processed.

Figure 4:
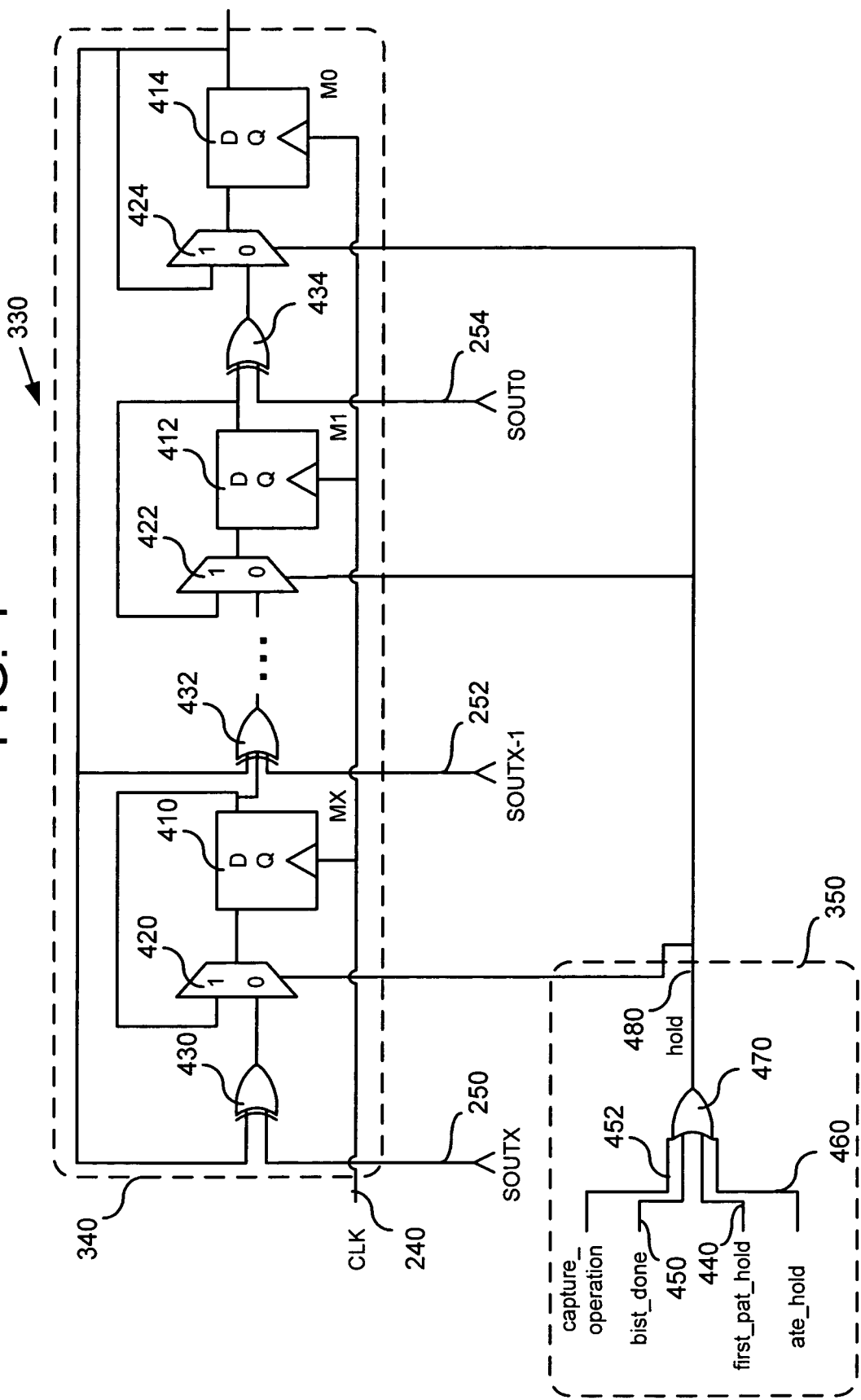
FIG. 4 is a circuit diagram of dynamic signature hold logic which may be used to suspend signature generation in a signature generation element for a pattern, such as a first pattern, of a test sequence.

Referring to FIG. 4, in an illustrated embodiment, scan monitor 330 comprises dynamic signature hold logic 350, which is used to suspend signature generation in a signature generation element during, for example, the first pattern (pc=0) of a test sequence.

In the illustrated embodiments, the signature generation element is a MISR (e.g., MISR 340 (FIG. 3)) implemented as a linear feedback shift register (LFSR) clocked by a system clock. For example, referring to FIG. 4, in an illustrated embodiment, scan monitor 330 comprises MISR 340 coupled with dynamic signature hold logic 350. MISR 340 includes flip-flops 410, 412 and 414, multiplexors 420, 422 and 424, and XOR gates 430, 432 and 434. MISR 340 is coupled to clock signal 240. Response data from scan chains 170, 172 and 174 in CUT 110 (FIG. 3) are shifted into MISR 340 via scan out signals 250, 252 and 254. Although the MISR is shown with three stages, it may include any number of stages In the embodiment illustrated in FIG. 4, dynamic signature hold logic 350 causes signature generation in MISR 340 to be suspended for the first pattern in a sequence. In this example, dynamic signature hold logic 350 comprises first_pat_hold signal 440, bist_done signal 450, capture_operation signal 452 and ate_hold signal 460 coupled to OR gate 470. The first_pat_hold signal 440 is active during the first pattern of the test sequence (pc=0). The output of OR gate 470 is hold signal 480. Thus, hold signal 480 is active (and signature generation in MISR 340 is suspended) if the first pattern is being shifted in (pc=0), if the last pattern is being shifted in (pc=N), or if the ATE is transmitting a hold signal. (Hold signals originating from the ATE are discussed in detail below.) However, to suspend signature generation for only the first test pattern, neither ate_hold signal 460, capture_operation signal 452, nor bist_done signal 450 are required.

When hold signal 480 is active, the hold signal sets multiplexors 420, 422 and 424 such that the values currently stored in flip-flops 410, 412 and 414 do not change. Specifically, the flip-flop values are cycled back through multiplexors 420, 422 and 424 into flip-flops 410, 412 and 414. New data received from scan out signals 250, 252 and 254 is ignored, and further signature generation is temporarily suspended. Thus, the signature in MISR 340 does not change during clock cycles in which hold signal 480 is active.

Figure 5:
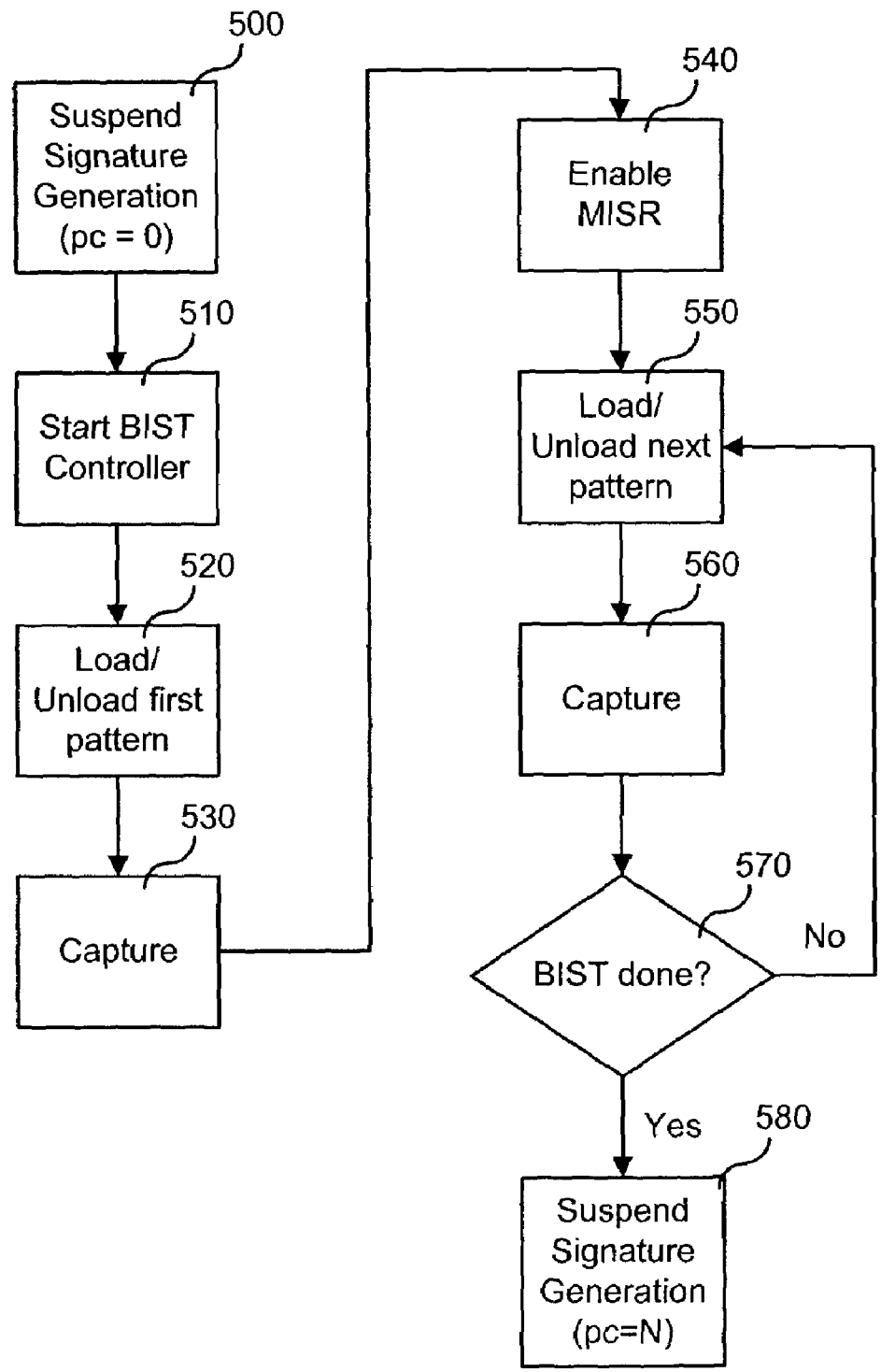
FIG. 5 is a flowchart illustrating a suspension of signature generation for a first pattern in a test sequence.

FIG. 5 is a flowchart illustrating a method of suspending signature generation in a signature generation element for the first pattern in a test sequence. The signature generation in the signature generation element (e.g., a MISR) is suspended (500) when a hold signal (e.g., first_pat_hold signal 440 (FIG. 4)) is active for the first pattern (pc=0). The logic BIST controller is started (510), and the first pattern is loaded into the scan chains of the CUT while response data from the uninitialized scan chains are unloaded into the MISR (520). However, because signature generation is suspended for the first pattern, the MISR is not corrupted with the response data from the uninitialized scan chains.

Figure 8:
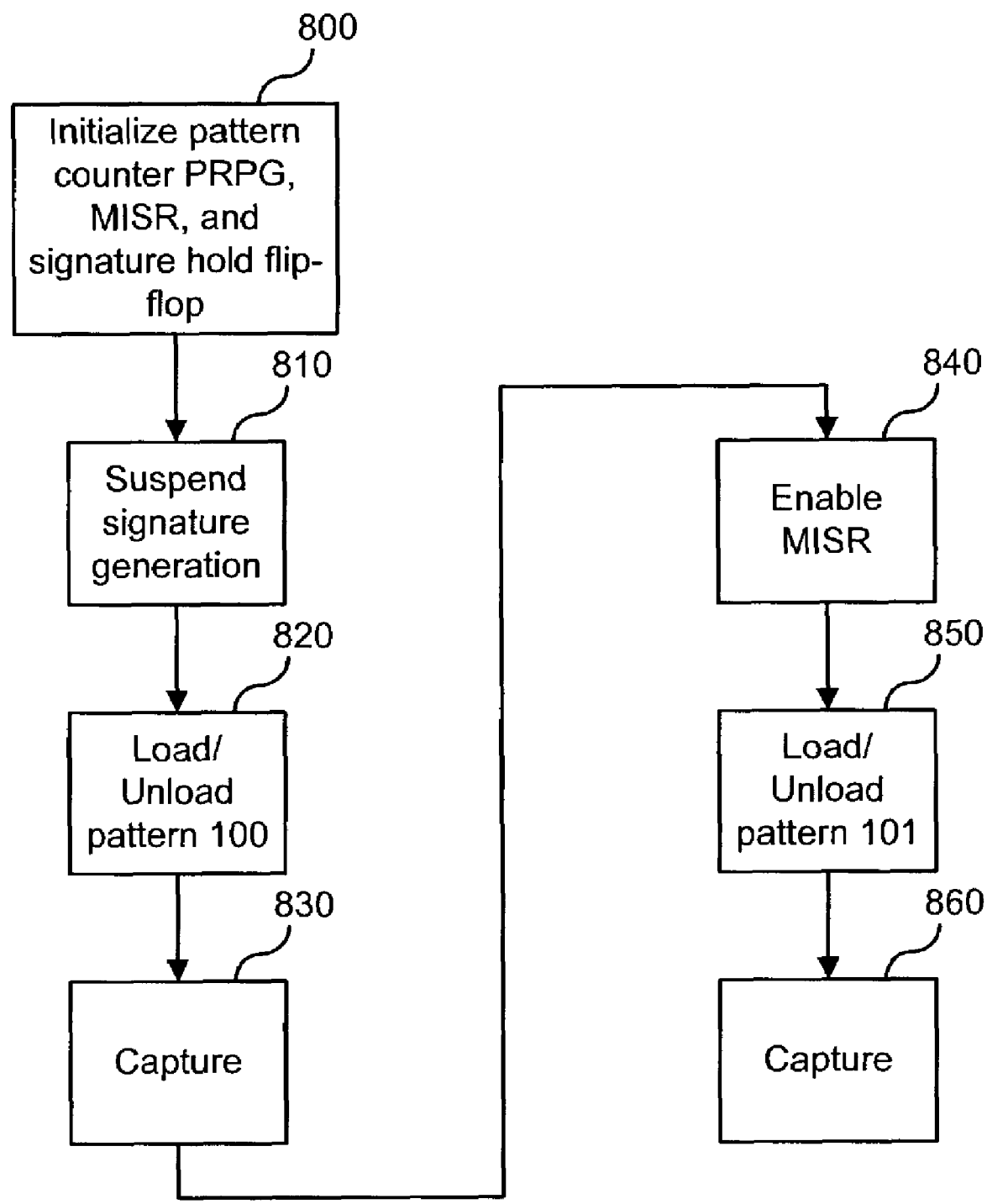
FIG. 8 is a flowchart illustrating a suspension of signature generation for a pattern.

Response data from the application of the first pattern to the CUT is captured (530). During capture, the MISR and the PRPG are deactivated because no test patterns or test responses are being input to or output from the scan chains. Deactivating the MISR and PRPG helps to avoid potential timing problems during this stage. Deactivating the MISR and PRPG during capture also may be performed in other embodiments, such as those described in FIGS. 8, 10 and 11.

After capture, the MISR is enabled (e.g., signature generation is no longer suspended, such as by deactivating the first_pat_hold signal) (540) and the next pattern (pc=1) is loaded while response data from the first pattern (pc=0) is unloaded (550) into the enabled MISR. After the load/unload cycle in process block 550 is complete, the response data for the pattern just loaded into the CUT (pc=1) is captured (560). In process block 570, if the pattern counter is now equal to N (the last pattern in the sequence), bist_done is active, and the signature generation is suspended for the final pattern (580). Otherwise, subsequent patterns are processed until the final pattern is reached.

Suspending Signature Generation for Patterns After the First Pattern in a Test Sequence In some embodiments, dynamic signature hold logic 350 comprises a scan-loadable signature hold flip-flop. When used with a pattern counter module having programmable start and stop values, the scan-loadable signature hold flip-flop makes it possible to stop and restart the logic BIST controller from any selected pattern within a pattern range for which the logic BIST controller has been configured, and to run the test from the selected pattern to any desired subsequent pattern. In this manner, the BIST session may be run incrementally, testing and reporting intermediate MISR signatures as the test run progresses.

With an incremental approach, signature mismatches can be diagnosed in an individual failing test pattern using, for example, a binary search across a pattern space. In some embodiments, individual failing test patterns are identified using the following algorithm:

1. Given a pattern space J..K, run the BIST session for this pattern space.
2. If the MISR signature at K is as expected then the pattern space contains no failures.
3. If the MISR signature at K is incorrect, then subdivide the pattern space and run the BIST session within the subdivisions until an individual failing pattern is identified.

Figure 6:
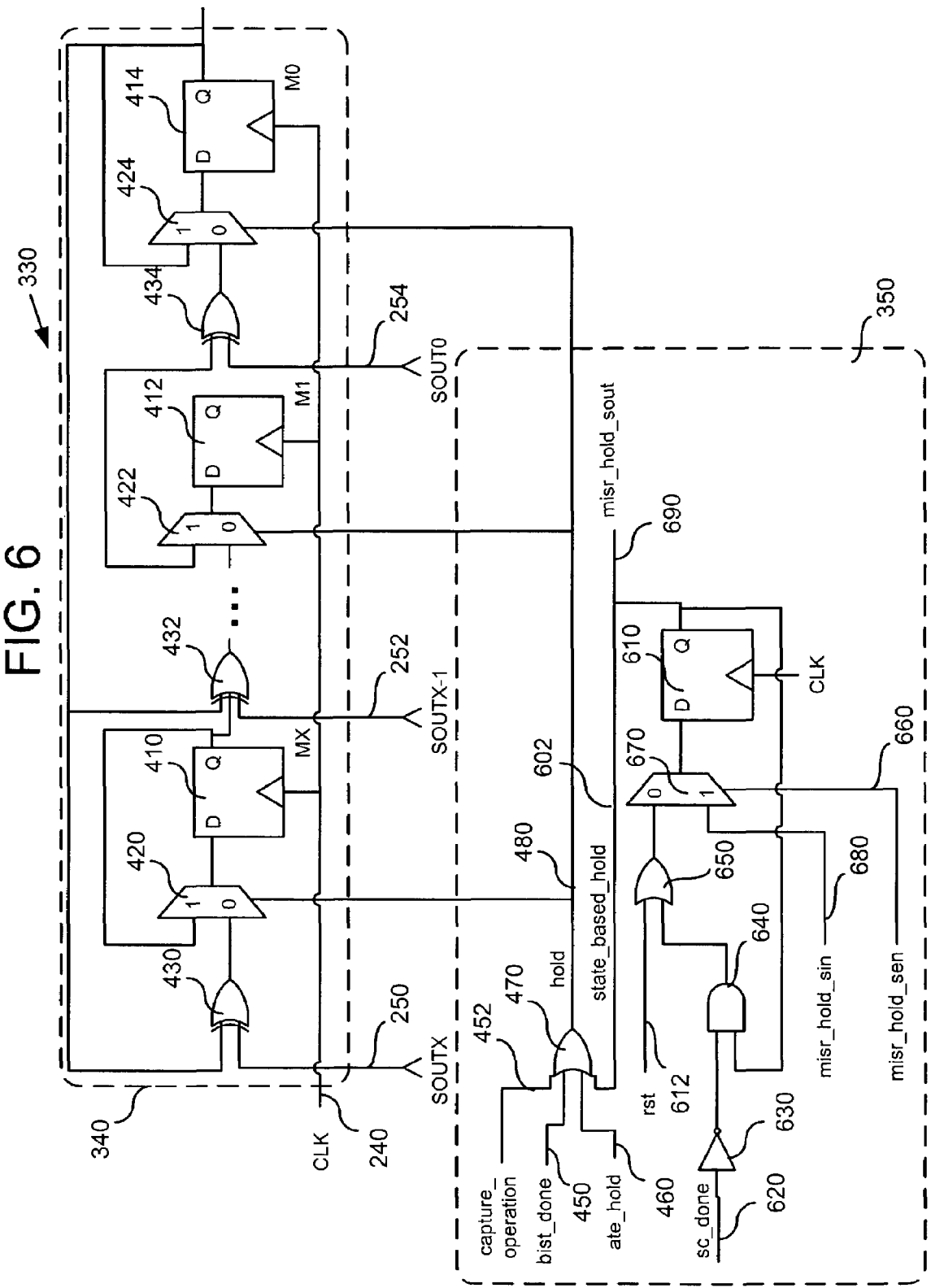
FIG. 6 is a circuit diagram of one embodiment of dynamic signature hold logic which may be used to suspend signature generation in a signature generation element for any pattern in a test sequence.

Referring to FIG. 6, scan monitor 330 includes another embodiment of dynamic signature hold logic 350. Dynamic signature hold logic 350 comprises OR gate 470, which takes as one of its inputs state_based_hold signal 602. The state_based_hold signal 602 is the output of signature hold flip-flop 610. Signature hold flip-flop 610 is a scan-loadable memory element that stores control data and outputs a control bit. The control bit is active (causing signature generation to be suspended) while the first pattern of a desired pattern sequence is shifted into the scan chains in the CUT. For example, if the pattern sequence beginning at pc=n and ending at pc=n+5 is to be run, signature hold flip-flop 610 is set such that the control bit is active while test pattern data for pattern n is shifted into the scan chains. The misr_hold_sen signal 660 controls multiplexor 670 and allows misr_hold_sin 680 to set the control bit to be active while the test pattern data for pattern n is shifted in. The current value of the control bit can be determined by monitoring misr_hold_sout signal 690.

When shifting is complete for the first pattern of the desired sequence (e.g., pc=n), a signal indicating that the shifting is done (e.g., sc_done signal 620) is made active. Inverter 630 forces the output of AND gate 640 low. The low signal is provided as input to OR gate 650. If rst signal 612 is also inactive, state_based_hold signal 602 is inactive on the next clock cycle. If bist_done signal 450 and ate_hold signal 460 are also inactive, the MISR will be enabled (e.g., signature generation will not be suspended) for pattern pc=n+1.

As noted above, in some embodiments, a pattern counter module is used by the logic BIST controller to keep track of how many patterns have been applied to the circuit under test. The pattern counter module may include a serial shift register interface for loading a start and stop values for the pattern counter. Dynamic signature hold logic 350 can be implemented such that a signature hold flip-flop 702 is part of the pattern counter module shift register interface.

Figure 7:
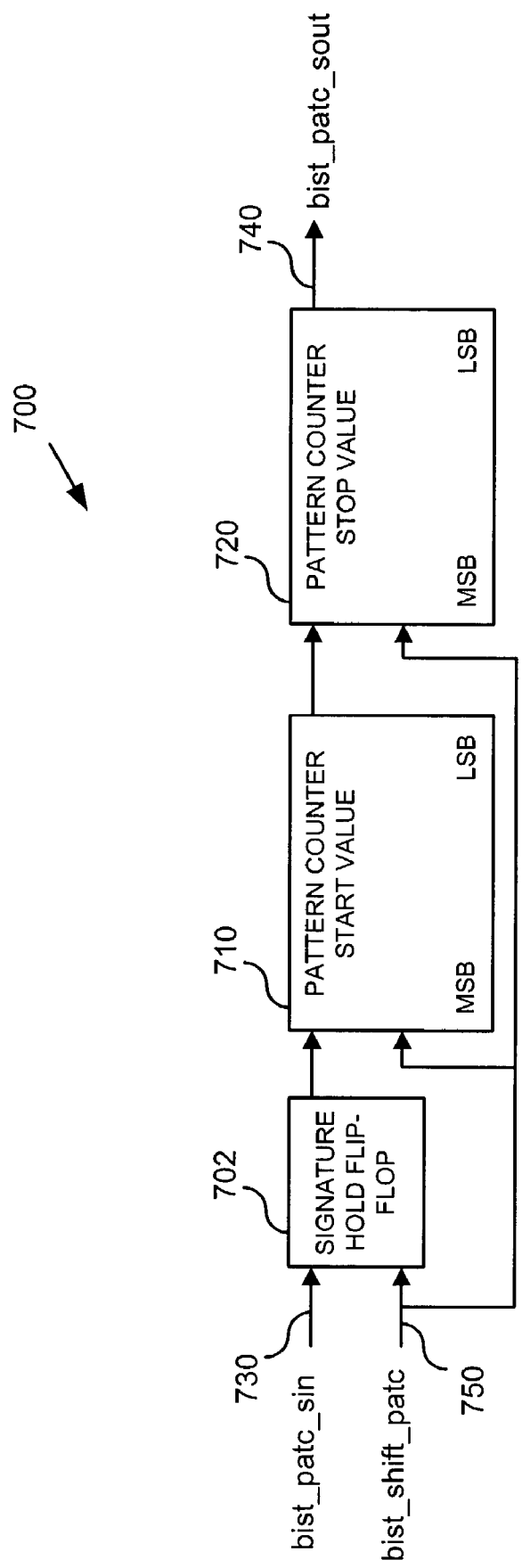
FIG. 7 illustrates a serial shift register interface comprising a signature hold flip-flop.

For example, referring to FIG. 7, serial shift register interface 700 comprises registers 710 and 720. Pattern counter start value register 710 and pattern counter stop value register 720 are loaded with starting and ending pattern numbers to define the range of patterns driven through the core during a particular test. Serial input bist_patc_sin 730 allows data to be shifted into the pattern counter module, and serial output bist_patc_sout 740 allows data to be shifted out of the pattern counter module. Signal bist_shift_patc 750 puts the pattern counter module into serial shift register mode.

While the pattern counter start value, pattern counter end value, PRPG, signature generation element (e.g., a MISR) and signature hold flip-flop are generally reset to default values when the logic BIST controller is reset (e.g., when rst signal 612 is active), serial shift register interfaces for these components can be used to override the default values. In some embodiments, this is done by scan loading start and stop values for the pattern counter, and values for the PRPG, MISR and signature hold flip-flop. In this way, compound effects of failing patterns can be eliminated by restarting the BIST controller at different points in a test sequence. The values to be loaded vary depending on the pattern range to be exercised.

For example, in one embodiment (referring to FIG. 8), when running the BIST controller for a test sequence starting at pattern number 101 (pc=101), the pattern counter, PRPG, MISR, and signature hold flip-flop are initialized (800): the pattern counter is loaded with the start value 100; and the PRPG is loaded with the test data corresponding to pattern 100. The MISR, on the other hand, is loaded with the correct initial value for pattern 101, and the signature hold flip-flop is set to suspend signature generation in the MISR. Signature generation is suspended (810), and pattern 100 is run (820, 830), inducing the correct scan chain state for pattern 101. After pattern 100 is run, the MISR is enabled (840) for pattern 101. Pattern 101 is then run (850, 860). This method allows a test sequence to begin at a pattern number (other than pc=0) without initializing the scan chains. Suspending signature generation while a pattern in the desired sequence is being shifted in means that data concurrently shifted out of the uninitialized scan chains does not corrupt the MISR.

Figure 9:
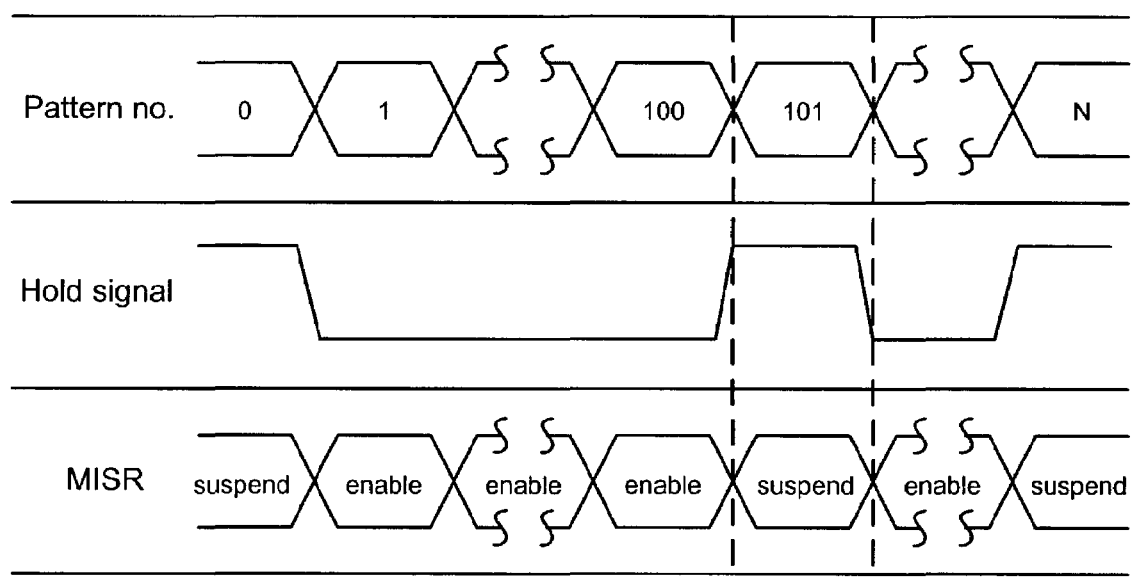
FIG. 9 is a timing diagram for a suspension of signature generation for a pattern.

FIG. 9 shows exemplary timing diagrams for the case where signature generation is suspended for an entire pattern (pattern number 101, where the response data captured for pattern number 100 is unloaded into the MISR). FIG. 9 also shows that, in this example, signature generation is suspended for pattern 0 and for pattern N. Additionally, the MISR can be deactivated during capture operations.

Suspending Signature Generation Using External Hold Signals

Referring again to FIG. 3, in some embodiments, dynamic signature hold logic 350 can be implemented such that ATE 120 can suspend signature generation in a signature generation element at selected times during a BIST session. Controlling the signature generation element externally provides a degree of immunity from design changes that introduce unbounded X sources into the CUT. Such design changes sometimes make signatures unpredictable by introducing X states into the signature generation element (e.g., a MISR). Suspending signature generation with an external hold signal prevents complete patterns or individual shift cycles from tainting the MISR with X states.

Figure 10:
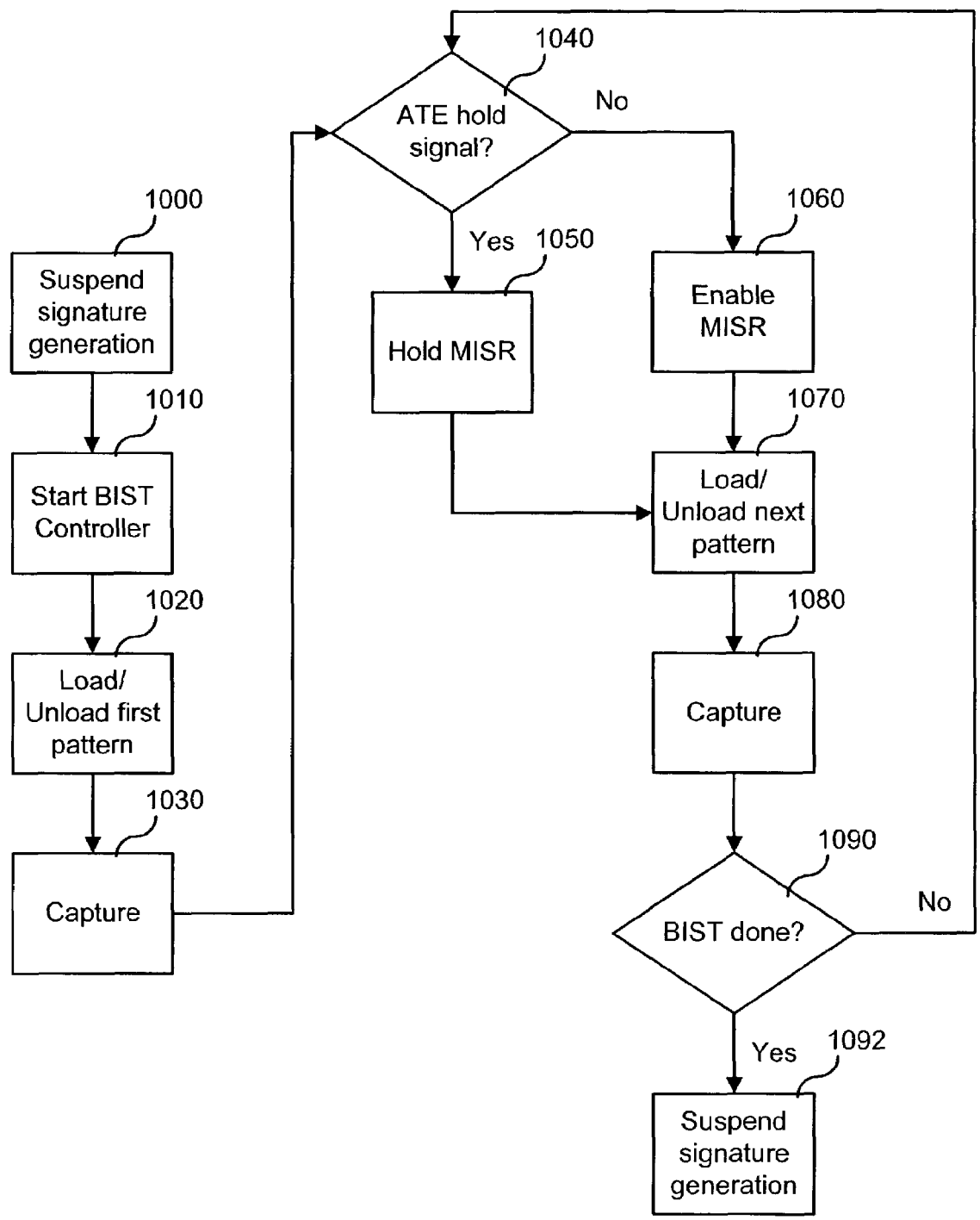
FIG. 10 is a flowchart illustrating an ATE-controlled suspension of signature generation for a pattern.

In an illustrated embodiment, suspension of signature generation is externally controllable through an external hold signal, represented in FIGS. 4 and 6 as ate_hold signal 460. FIG. 10 is a flowchart illustrating an ATE-controlled suspension of signature generation for a pattern. In the illustrated embodiment, signature generation in the signature generation element (e.g., a MISR) is suspended (1000) for the first pattern. The BIST controller is started (1010), and the first pattern is loaded into the scan chains of the CUT while response data from the scan chains is unloaded into the MISR (1020). However, because signature generation is suspended, if the scan chains were uninitialized, the MISR will not be corrupted by the unloaded response data. Response data from the application of the first pattern to the CUT is captured (1030). In process block 1040, if the external hold signal is active, signature generation is suspended (e.g., the signature does not change) for the next pattern (1050). If the external hold signal is not active, signature generation is enabled (e.g., not suspended) (1060). The next pattern is loaded and unloaded (1070). After the load/unload cycle is complete, the response data for the pattern just loaded into the CUT is captured (1080). In process block 1090, if the pattern just completed was the last pattern in the sequence, signature generation is suspended for the final pattern (1092). However, suspending signature generation for the final pattern is not required. If the pattern just completed was not the final pattern, subsequent patterns are processed until the final pattern is complete. However, in some cases, the test may be stopped before the final pattern is complete.

In other embodiments, the ATE may cause signature generation to be suspended for individual shift cycles within a test pattern to minimize fault coverage loss associated with suspending signature generation for an entire pattern. A single pattern can be repeated and the external hold signal asserted at successive points in the unload phase. The complete set of MISR values for the entire unload can then be extracted. These MISR values can be used to determine which scan chain elements are faulty.

Figure 11:
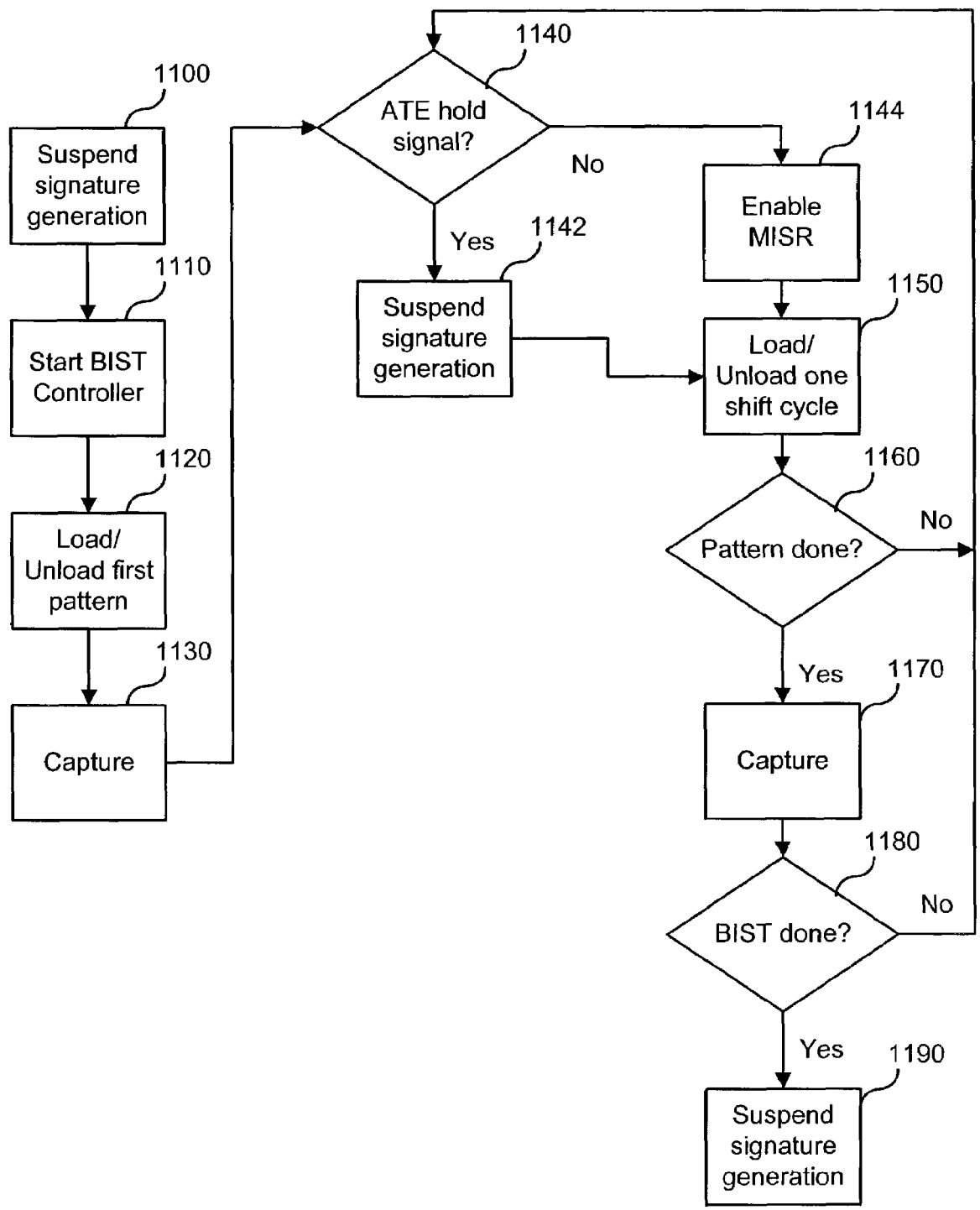
FIG. 11 is a flowchart illustrating an ATE-controlled suspension of signature generation for a portion of a pattern.

FIG. 11 is a flowchart illustrating an ATE-controlled suspension of signature generation for an individual shift cycle. In an illustrated embodiment, the signature generation is suspended (1100) for the first pattern. The BIST controller is started (1110), and the first pattern is loaded into the scan chains of the CUT while response data from the scan chains is unloaded into the MISR (1120). However, because signature generation is suspended, if the scan chains were uninitialized, the MISR will not be corrupted by the unloaded response data. Response data from the first pattern is captured (1130).

After suspending signature generation for the first pattern, the external hold signal (1140) may cause signature generation to be suspended (1142) for a single shift cycle within a pattern. If not, the MISR is enabled (e.g., signature generation is not suspended) (1144). The next shift cycle in the pattern is loaded and unloaded (1150). If the pattern is complete (1160), the response data is captured (1170), and the test continues (1180, 1190) until the last pattern has been run. If the pattern is not complete, subsequent shift cycles are loaded and unloaded the shifting for that pattern is done. Signature generation may or may not be suspended during each of those shift cycles.

Figure 12A:
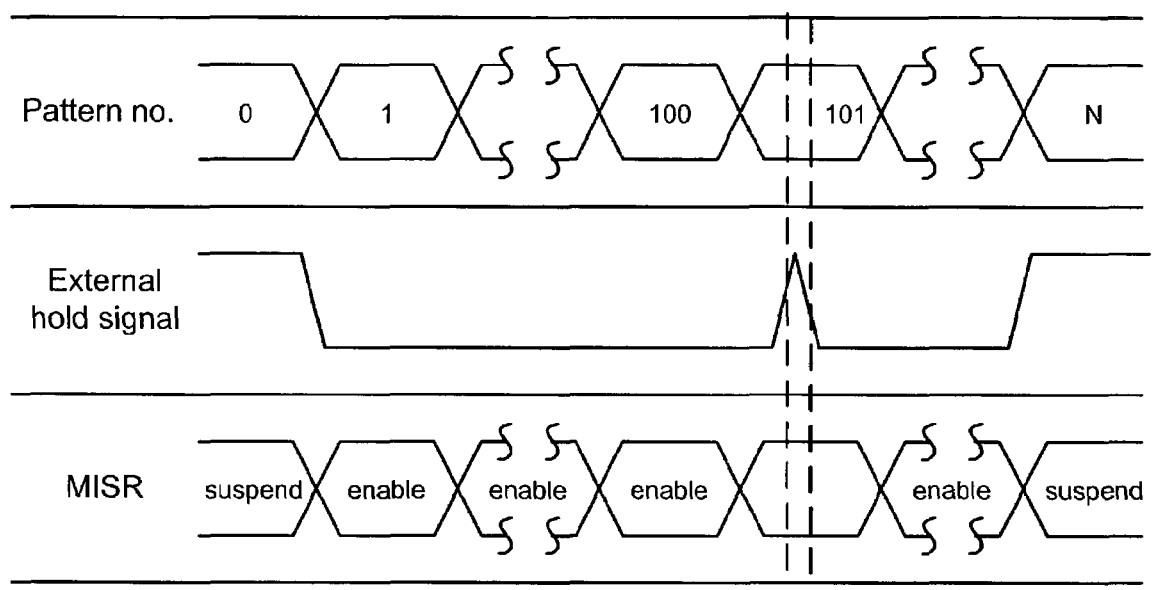
FIGS. 12A and 12B are timing diagrams illustrating wave forms for an ATE-controlled suspension of signature generation for an individual shift cycle.
Figure 12B:
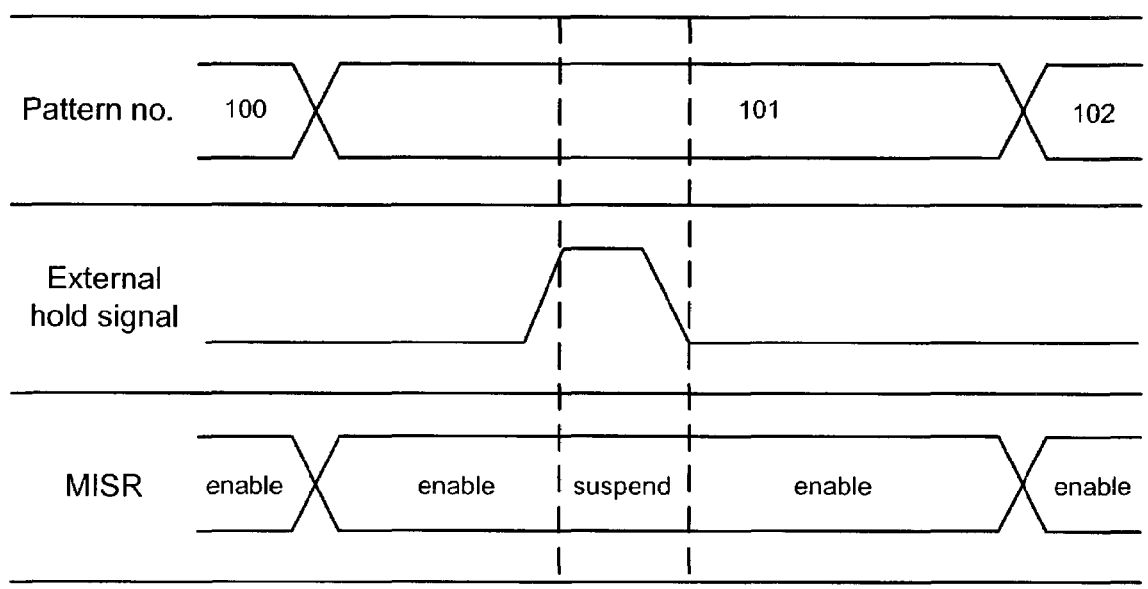

FIGS. 12A and 12B show exemplary timing diagrams for the case of signature generation in a MISR being suspended for a single bit shift in pattern number 101. FIG. 12A also shows that, in this example, signature generation is suspended for pattern 0 and for pattern N. Additionally, the MISR can be deactivated during capture operations.

Suspending Signature Generation Using a Rotating Hold Ring

Figure 13:
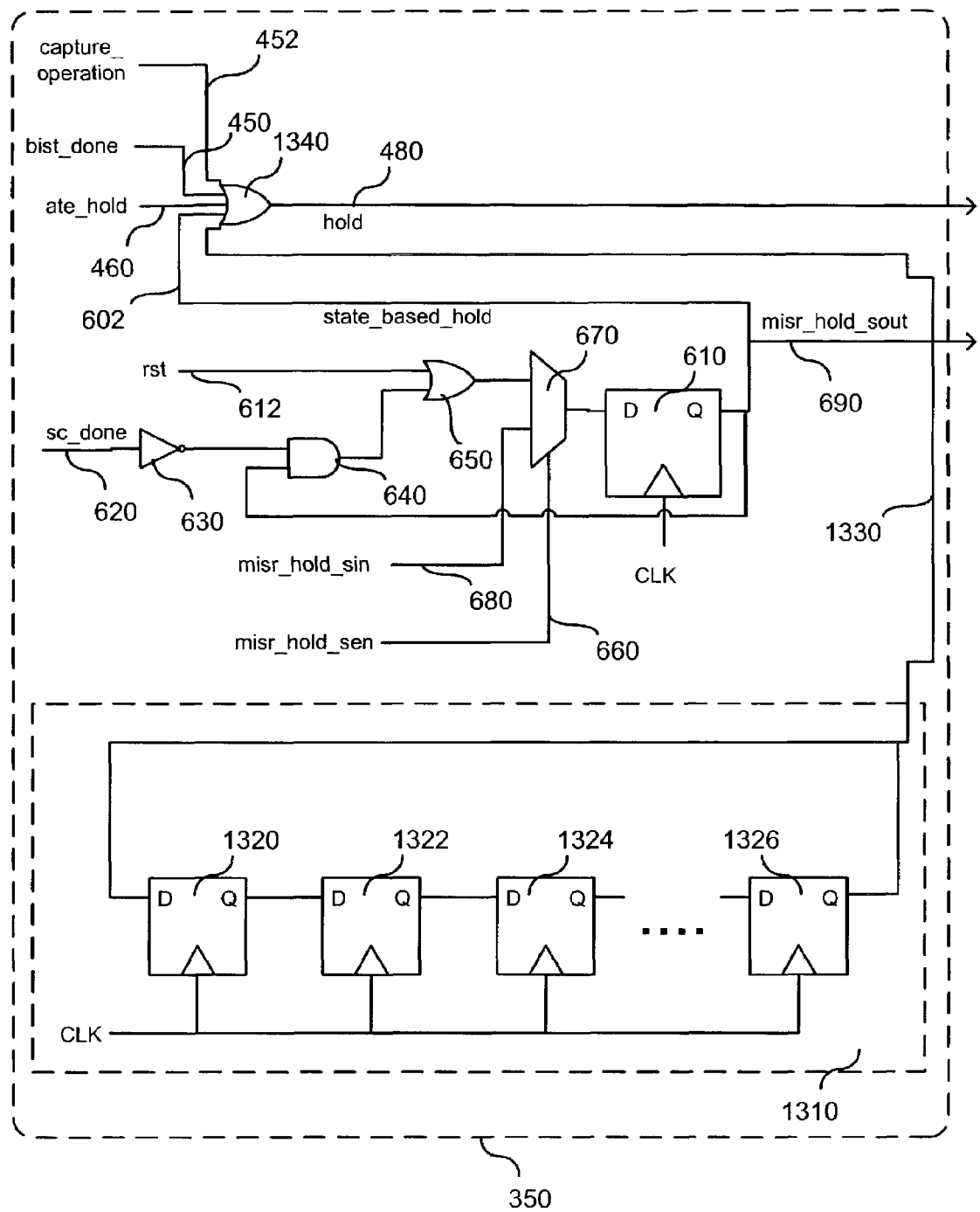
FIG. 13 is a circuit diagram of dynamic signature hold logic comprising a rotating hold ring.

In another illustrated embodiment, referring to FIG. 13, dynamic signature hold logic 350 comprises rotating hold ring 1310. Rotating hold ring 1310 is used to allow synchronized suspending of signature generation in a signature generation element for individual shift cycles. Such an arrangement provides a degree of immunity for design changes that introduce unbounded X sources into the CUT, including changes made late in the design process. This embodiment is desirable because the rotating hold ring can be programmed once prior to running the logic BIST controller for a range of patterns, requiring less ATE interaction than when using an external hold signal.

Rotating hold ring 1310 includes a flip-flop (e.g., flip-flops 1320, 1322, 1324 and 1326) for each shift cycle needed to shift a complete test pattern into a CUT. For example, if one hundred shifts must be performed before a test pattern is done shifting into a CUT, then rotating hold ring 1310 would include one hundred flip-flops. Rotating hold ring 1310 can be programmed by setting each flip-flop to a desired value. When running, rotating hold ring 1310 produces a signal 1330 which is either active or inactive for a given clock cycle depending on the states of the flip-flops. In some embodiments, signal 1330 is active during clock cycles in which signature generation in a signature generation element (e.g., a MISR) is to be suspended, and inactive during clock cycles in which signature generation is to be enabled. In this way, rotating hold ring 1310 can send a signal via OR gate 1340 to suspend signature generation during predetermined shift cycles.

Serial Shift Register Mode

Referring again to FIGS. 4 and 6, multiplexors 420, 422 and 424 allow a serial shift register mode to be implemented. In serial shift register mode, data advances through the shift registers at each consecutive system clock positive (or negative) edge transition as defined by the off-state of the master clock. Serial interfaces to a signature generation element (e.g., a MISR) or a PRPG can be used to shift in initialization values to the PRPG and shift out the final MISR signature. A serial shift register mode can be enabled, for example, by setting a bist_shift_lfsr signal (see Table 1 below) to be active. PRPGs and MISRs can be reset to default values, such as when the logic BIST controller is reset. For example, in some embodiments, the PRPG and MISR are reset to default values whenever a bist_reset signal (see Table 1 below) is active.

Exemplary Logic BIST Controller Signals

In some embodiments, a logic BIST controller comprising dynamic signature hold logic can be controlled by a set of signals. An exemplary set of signals that may be used to control a logic BIST controller in such embodiments is described in Table 1.

TABLE 1

Basic Logic BIST Controller Interface

| Signal Name | Mode | Description |
| --- | --- | --- |
| bist_clk | Input | Clock signal from core design which drives the BIST controller (this can be controlled by the user for multi-clock designs) |
| bist_tck | Input | For controllers that contain a tap interface, the bist_tck signal drives the internal logic, except when the test is actually running. |
| bist_select | Input | Main "enable" signal for logic BIST; enables bist_reset and bist_run. |
| bist_reset | Input | Synchronous or asynchronous reset for the BIST controller |
| bist_run | Input | Synchronous BIST trigger signal |
| bist_done | Output | BIST completion signal |
| bist_lfsr_sin | Input | Serial input for shifting data through PRPG and MISR |
| bist_lfsr_sout | Output | Serial output for shifting data through PRPG and MISR |
| bist_shift_lfsr | Input | Put PRPG and MISR into serial shift register mode |

TABLE 1-continued

Basic Logic BIST Controller Interface

| Signal Name | Mode | Description |
| --- | --- | --- |
| select_single_chain | Input | Allows controllers with the single_chain option enabled to shift data through top_single_in and top_single_out |
| select_tck_test | Input | Allows entire test to be run using the bist_tck input, rather than bist_clk, for controllers containing a tap interface |
| bist_patc_sin | Input | Serial input for shifting data through the pattern counter |
| bist_patc_sout | Output | Serial output for shifting data through the pattern counter |
| bist_shift_patc | Input | Put pattern counter in serial shift register mode |

Having illustrated and described the principles of the illustrated embodiments, it will be apparent to those skilled in the art that the embodiments can be modified in arrangement and detail without departing from such principles. For example, as an alternative to applying hold signals to a signature generation element, signature generation may be suspended by turning off the system clock. Further, hold logic, such as dynamic signature hold logic, may be included in the signature generation element or may be separate from the signature generation element.

In view of the many possible embodiments, it will be recognized that the illustrated embodiments include only examples of the invention and should not be taken as a limitation on the scope of the invention. Rather, the invention is defined by the following claims. We therefore claim as the invention all such embodiments that come within the scope of these claims.

We claim:

1. A built-in self-test circuit to test logic within an integrated circuit, comprising:

a scan driver coupled to a circuit under test to generate a sequence of test patterns in a test of the integrated circuit;

one or more scan chains in the circuit under test, the one or more scan chains for receiving the test patterns during loading of the test patterns and for outputting test responses;

a scan monitor coupled to the circuit under test to receive the test responses output from the one or more scan chains;

wherein the scan monitor comprises hold logic coupled to a signature generation element, wherein the hold logic suspends signature generation for one or more but not all test responses to a complete test pattern by holding a signature value in the signature generation element such that the signature value in the signature generation element does not change while signature generation is suspended, wherein the hold logic is configured to receive a set of signals generated in testing circuitry, the set of signals including a signal indicating a first test pattern of the sequence of test patterns, a signal indicating that a test is finished, an external hold signal, and a capture operation signal, and wherein the hold logic suspends signature generation in response to one or more signals of the set of signals generated in testing circuitry.

2. The built-in self-test circuit of claim 1, wherein the scan monitor is internally or externally programmable.

3. The built-in self-test circuit of claim 1 further comprising an external automated testing equipment input coupled to the hold logic to suspend signature generation as controlled by automated testing equipment.

4. The built-in self-test circuit of claim 1, wherein the signature generation element comprises a multiple input signature register.

5. The built-in self-test circuit of claim 4, wherein the multiple input signature register is implemented as a linear feedback shift register.

6. The built-in self-test circuit of claim 1, wherein the one or more scan chains comprise serially coupled memory elements.

7. The built-in self-test circuit of claim 1, wherein the hold logic comprises at least one signature hold flip-flop that suspends signature generation in the signature generation element and that restarts testing of the circuit under test.

8. The built-in self-test circuit of claim 7 wherein the signature hold flip-flop is scan loadable.

9. The built-in self-test circuit of claim 7 wherein the signature hold flip-flop is coupled to a serial shift register interface.

10. The built-in self-test circuit of claim 9 wherein the serial shift register interface is operable to run in a serial shift register mode.

11. The built-in self-test circuit of claim 7 wherein the hold logic that comprises at least one signature hold flip-flop comprises a rotating hold ring.

12. The built-in self-test circuit of claim 11 wherein the rotating hold ring is programmable and comprises serially coupled memory elements.

13. The built-in self-test circuit of claim 1 further comprising a shift counter coupled to the hold logic.

14. The built-in self-test circuit of claim 1 further comprising a pattern counter coupled to the hold logic.

15. The built-in self-test circuit of claim 1, wherein the scan driver comprises a pseudo-random pattern generator.

16. The built-in self-test circuit of claim 1, wherein the hold logic is configured to suspend signature generation for one or more but not all test responses to a complete test pattern while at least one of the sequence of test patterns continues to be supplied to the one or more scan chains.

17. The built-in self-test circuit of claim 1, wherein the hold logic suspends the signature generation in response to the signal indicating the first test pattern.

18. The built-in self-test circuit of claim 1, wherein the hold logic suspends the signature generation in response to the external hold signal.

19. A built-in self-test circuit to test logic within an integrated circuit, comprising:
a scan driver coupled to a circuit under test and configured to generate a sequence of test patterns during a test of the integrated circuit, wherein the sequence of test patterns comprises at least a first test pattern and a last test pattern;
one or more scan chains in the circuit under test to receive the test patterns during loading of the test patterns and to output test responses; and
a scan monitor coupled to the circuit under test to receive the test responses output from the one or more scan chains, wherein the scan monitor comprises hold logic coupled to a signature generation element, and wherein the hold logic suspends signature generation by suspending one or more clock signals to the signature generation element such that the signature value in the signature generation element does not change while signature generation is suspended for one or more but not all test responses to a complete test pattern, wherein the hold logic is configured to receive a set of signals generated in testing circuitry, the set of signals including a signal indicating the first test pattern, a signal indicating that a test is finished, an external hold signal, and a capture operation signal, and wherein the hold logic suspends signature generation in response to one or more signals of the set of signals generated in testing circuitry.

20. The built-in self-test circuit of claim 19, wherein the hold logic suspends the signature generation in response to the signal indicating the first test pattern.

21. The built-in self-test circuit of claim 19, wherein the hold logic suspends the signature generation in response to the external hold signal.

22. A built-in self-test circuit to test logic within an integrated circuit, comprising:
a scan driver coupled to a circuit under test and configured to generate a sequence of test patterns in a test of the integrated circuit;
one or more scan chains in the circuit under test, the one or more scan chains for receiving the test patterns during loading of the test patterns and for outputting test responses; and
a scan monitor coupled to the circuit under test to receive the test responses output from the one or more scan chains, wherein the scan monitor comprises hold logic coupled to a signature generation element, wherein the hold logic is configurable to selectively suspend signature generation such that the signature value in the signature generation element does not change while signature generation is suspended, wherein the hold logic is configured to receive a set of signals generated in testing circuitry, the set of signals including a signal indicating a first test pattern in the sequence of test patterns, a signal indicating that a test is finished, an external hold signal, and a capture operation signal, and wherein the hold logic suspends signature generation in response to one or more signals of the set of signals generated in testing circuitry.

23. The built-in self-test circuit of claim 22, wherein the hold logic suspends the signature generation in response to the signal indicating the first test pattern in the sequence of test patterns.

24. The built-in self-test circuit of claim 22, wherein the hold logic suspends the signature generation in response to the external hold signal.

* * * * *

UNITED STATES PATENT AND TRADEMARK OFFICE
CERTIFICATE OF CORRECTION

PATENT NO. : 7,644,333 B2 Page 1 of 1
APPLICATION NO. : 10/194377
DATED : January 5, 2010
INVENTOR(S) : Hill et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 298 days.

Signed and Sealed this

Sixteenth Day of November, 2010

David J. Kappos
*Director of the United States Patent and Trademark Office*